(12) United States Patent
Kim et al.

(10) Patent No.: US 7,492,213 B2
(45) Date of Patent: Feb. 17, 2009

(54) HIGH-VOLTAGE GENERATING CIRCUIT INCLUDING CHARGE TRANSFER SWITCHING CIRCUIT FOR SELECTIVELY CONTROLLING BODY BIAS VOLTAGE OF CHARGE TRANSFER DEVICE

(75) Inventors: Jung-sik Kim, Suwon-si (KR); Soo-man Hwang, Hwaseong-si (KR); Young-min Jang, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 11 days.

(21) Appl. No.: 11/709,768

(22) Filed: Feb. 23, 2007

(65) Prior Publication Data
US 2007/0286007 A1     Dec. 13, 2007

(30) Foreign Application Priority Data
Feb. 23, 2006   (KR) ............... 10-2006-0017883

(51) Int. Cl.
*G05F 1/10*     (2006.01)
(52) U.S. Cl. .................... 327/536; 327/390
(58) Field of Classification Search ............. 327/390, 327/391, 534, 536, 537
See application file for complete search history.

(56) References Cited

U.S. PATENT DOCUMENTS

| | | | | |
|---|---|---|---|---|
| 6,683,488 B2* | 1/2004 | Jin | ............... | 327/536 |
| 6,693,480 B1* | 2/2004 | Wong | ............... | 327/390 |
| 6,812,774 B2* | 11/2004 | Kim | ............... | 327/536 |
| 7,295,058 B2* | 11/2007 | Kook et al. | ............. | 327/536 |
| 7,411,318 B2* | 8/2008 | Kimura | ............. | 307/113 |

FOREIGN PATENT DOCUMENTS

| | | |
|---|---|---|
| JP | 2000-236658 | 8/2000 |
| KR | 1020010009333 A | 5/2001 |
| KR | 1020040076336 A | 9/2004 |
| KR | 1020050040072 | 5/2005 |
| KR | 1020060018047 | 2/2006 |

OTHER PUBLICATIONS

Office Action for corresponding Korean Application dated Jan. 29, 2007.

* cited by examiner

*Primary Examiner*—Jeffrey S Zweizig
(74) *Attorney, Agent, or Firm*—Harness, Dickey & Pierce, P.L.C.

(57) ABSTRACT

Provided are a charge transfer switch circuit for selectively controlling body bias voltage of a charge transfer device, and a boosted voltage generating circuit having the same. The charge transfer switch circuit may include a capacitor whose voltage is boosted based on first and second control signals, a first transistor connected between a supply voltage and the capacitor and having a gate receiving a precharge signal, a second transistor connected between a first node and a second node and having a gate connected to a terminal of the capacitor, a third transistor connected between the first node and a bulk voltage of the second transistor and having a gate receiving the first control signal, and a fourth transistor connected between the bulk voltage of the second transistor and a ground voltage and having a gate receiving the second control signal.

3 Claims, 4 Drawing Sheets

– CHARGE TRANSFER –

$VBS = (-) VDD \sim (-) 1.5VEXT$
$/VGS = VPP-VDD \sim VPP-1.5VDD$

– PRECHARGING –

$V_{BS} = (-)\, 0.5VDD \sim (-)\, VDD$
$/V_{GS} = 0.5VDD \sim 0V$

HIGH-VOLTAGE GENERATING CIRCUIT INCLUDING CHARGE TRANSFER SWITCHING CIRCUIT FOR SELECTIVELY CONTROLLING BODY BIAS VOLTAGE OF CHARGE TRANSFER DEVICE

PRIORITY STATEMENT

This application claims the benefit of priority from Korean Patent Application No. 10-2006-0017883, filed on Feb. 23, 2006 in the Korean Intellectual Property Office, the entire contents of which is incorporated herein by reference.

BACKGROUND

1. Field

Example embodiments relate to a semiconductor integrated circuit. More particularly, example embodiments relate to an electric charge transfer switch circuit for selectively controlling a body bias voltage of a charge transfer device and a boosted voltage generating circuit having the same.

2. Description of the Related Art

Recently, DRAMs have been developed that are directed towards increasing the integration degree of memory cells of DRAMS while reducing the size of each memory cell and lowering an external supply voltage for the DRAM. For example, a supply voltage VDD for a DRAM may be lowered from approximately 5V to approximately 1.8V or 1.5V. If the supply voltage VDD is lowered to approximately 1.5V, a boosted voltage generating circuit may be used and/or required in a conventional DRAM to generate a boosted voltage of approximately 3.0V or more. The boosted voltage may be applied to a word line, a bit line, and a sense amplifier of a conventional DRAM. If a sense amplifier of a DRAM operates with a low external supply voltage, the operating speed of the sense amplifier is generally reduced and thus, the sense amplifier should generally operate with a boosted voltage. Also, in order to perform precharging of a bit line and a high speed write operation of a memory cell, a gate voltage for controlling the operations of transistors should be boosted.

FIG. 1 is a conceptual diagram illustrating a conventional boosted voltage generating circuit 100. Referring to FIG. 1, the boosted voltage generating circuit 100 includes three-stage pumping circuits 110, 120, and 130. The pumping circuits 110 through 130 sequentially perform pumping operations to generate a boosted voltage VPP. The pumping circuits 110 through 130 include capacitors C110, C120, C122, and C130 and switches S110, S120, S122, S124, S126, S130, S132, and S134, and boost nodes N110, N120, N122, and N132 to boost a voltage VPP to a voltage that is two or three times higher than a supply voltage VDD.

In the conventional boosted voltage generating circuit 100, the first pumping circuit 110 precharges the first boost node N110 to the supply voltage VDD in response to a first pumping signal P1, and boosts the first boost node N110 in response to a second pumping signal P2. The second pumping circuit 120 precharges the second and third boost nodes N120 and N122 in response to the first pumping signal P1, and boosts the second and third boost nodes N120 and N122 in response to the second pumping signal P2 and a third pumping signal P3, respectively. The third pumping circuit 130 precharges the fourth boost node N132 to the supply voltage VDD in response to the first pumping signal P1, and boosts the fourth boost node N132 in response to a fourth pumping signal P4.

In FIG. 1, the first pumping signal P1 controls the switches S110, S120, S122, and S130, and boosts the voltages of the first to fourth boost nodes N110, N120, N122, and N132 to the supply voltage VDD. The second pumping signal P2 is used to increase charges at the first and second boost nodes N110 and N120 via the capacitors C110 and C120, respectively. The third pumping signal P3 is used to increase charge at the third boost node N122 via the capacitor C122, and the fourth pumping signal P4 is used to increase charge at the fourth boost node N132 via the capacitor C130.

As shown in FIG. 1, the second boost node N120 is connected to the third boost node N122 to further increase the charge at the third boost node N122 via the switch S124. Likewise, the first and third boost nodes N110 and N122 are connected to the fourth boost node N132 to further increase charge at the fourth boost node N132 via the switches S126 and S132, respectively. The charge at the fourth boost node N132 is generated as the boosted voltage VPP via the switch S134. The first through fourth boost nodes N110, N120, N122, and N132 are precharged to the supply voltage VDD via the switches S110, S120, S122, and S130, respectively.

The operation of the conventional boosted voltage generating circuit 100 illustrated in FIG. 1 is described below with reference to a timing diagram illustrated in FIG. 2. Referring to FIG. 2, precharging and pumping operations are performed during a low cycle duration of a row cycle time (tRC) of a conventional memory device. In FIG. 2, a precharging duration is defined to be a duration between times t1 and t2, a first pumping duration is defined to be a duration between times t2 and t3, a second pumping duration is defined to be a duration between times t3 and t4, and a third pumping duration is defined to be a duration between times t4 and t5.

During the precharging duration, the first through fourth boost nodes N110, N120, N122, and N132 are precharged to the supply voltage VDD via the switches S110,S120, S22, and S132 in response to the first pumping signal P1. During the first pumping duration, pumping is performed by the capacitors C110 and C120 in response to the second pumping signal P2. During the second pumping duration, pumping is performed by the capacitor C122 in response to the third pumping signal P3. During the third pumping duration, pumping is performed by the capacitor C130 in response to the fourth pumping signal P4.

In the boosted voltage generating circuit 100 shown in FIG. 1, each of the switches S124, S126, S132, and S134 may be embodied as an NMOS transistor and may function as a charge transfer device. In general, a ground voltage is applied to a body of each of the NMOS transistors, and thus, the NMOS transistors operate while being affected by a negative back bias voltage. Therefore, during charge transfer, a threshold voltage Vt of each NMOS transistor is increased due to the body bias effect. The charge transfer operation of the switch S124, for example, is described with reference to FIG. 3.

It is assumed in FIG. 3 that a ratio of the capacity of the capacitor C120 to that of the capacitor C122 is 1:1. A drain voltage of the NMOS transistor acting as the switch 124 is changed from VDD to 2VDD and then to 1.5VDD when precharging, pumping, and charge transfer are sequentially performed as described with reference to FIG. 2. As a gate voltage of the NMOS transistor is changed from VDD to VDD+VPP, a source voltage of the NMOS transistor is increased from VDD to 1.5 VDD. In this case, a back bias voltage VBS of the NMOS transistor is reduced from −VDD to −1.5VDD and thus, the threshold voltage Vt of the NMOS transistor increased, thereby lowering the efficiency of charge transfer.

Further, if VPP is low, the gate voltage of the NMOS transistor is lowered, thereby significantly reducing the efficiency of charge transfer. Accordingly, VPP should be or is required to be a relatively high voltage.

FIG. 4 illustrates the conventional precharging operation of the switch S124 of FIG. 1. Referring to FIG. 4, a drain voltage of the NMOS transistor acting as the switch S124 is changed from 0.5VDD to VDD after a pumping operation. During a precharging operation, an applied gate voltage of the NMOS transistor is equal to VDD, and when a pumping operation starts in the next stage, a source voltage of the NMOS transistor is increased from 1.5VDD to 2.5VDD. Accordingly, in the beginning of precharging, charges flow backward from a drain of the NMOS transistor to a source thereof.

SUMMARY

Example embodiments provide a charge transfer switch circuit for selectively controlling a body bias voltage of a charge transfer device.

Example embodiments also provide a boosted voltage generating circuit. The boosted voltage generating circuit may include one or more example embodiments of charge transfer switch circuits.

An example embodiment provides an electric charge transfer circuit. The electric charge transfer circuit may include a first inverter receiving a first control signal requesting charge transfer, and generating a second control signal; a second inverter receiving the second control signal; a capacitor, a terminal of which is connected to an output of the second inverter; a first transistor connected between a source of a supply voltage and the other terminal of the capacitor, a gate of which receives a precharge signal; a second transistor connected between a first node and a second node, and a gate of which is connected to the other terminal of the capacitor; a third transistor connected between the first node and a bulk voltage of the second transistor, and a gate of which receives the first control signal; and a fourth transistor connected between the bulk voltage of the second transistor and a source of a ground voltage, a gate of which receives the second control signal.

According to an example embodiment, the first and second control signals and the precharge signal may be supplied with a boosted voltage higher than a supply voltage, and the first through fourth transistors may be NMOS transistors.

Another example embodiment provides a boosted voltage generating circuit. The boosted voltage generating circuit may include a first switch precharging a boost node to a supply voltage in response to a first pumping signal; a first capacitor boosting the boost node in response to a second pumping signal; and a charge transfer switch circuit connecting the boost node to a boosted voltage in response to the first and second pumping signals.

According to an example embodiment, the charge transfer switch circuit may include a first level shifter receiving the second pumping signal and generating the boosted voltage; a first inverter receiving the first control signal and generating a second control signal; a second inverter receiving the second control signal; a capacitor, a terminal of which is connected to an output of the second inverter; a second level shifter receiving the first pumping signal and generating a third control signal of the boosted voltage; a first transistor connected between a source of the supply voltage and the other terminal of the capacitor, a gate of which receives the third control signal; a second transistor connected between the boost node and the boosted voltage, a gate of which is connected to the other terminal of the capacitor; a third transistor connected between the boost node and the bulk voltage of the second transistor, a gate of which receives the first control signal; and a fourth transistor connected between the bulk voltage of the second transistor and a source of a ground voltage, a gate of which receives the second control signal.

Still another example embodiment provides a boosted voltage generating circuit. The boosted voltage generating circuit may include a first pumping terminal precharging a first boost node to a supply voltage in response to a first pumping signal, and boosting the first boost node in response to a second pumping signal; a second pumping terminal precharging a second boost node to the supply voltage in response to the first pumping signal, boosting the second boost node in response to the second pumping signal, precharging a third boost node in response to the first pumping signal, and boosting the third boost node in response to a third pumping signal; a third pumping terminal precharging a fourth boost node to the supply voltage in response to the first pumping signal, and boosting the fourth boost node in response to a fourth pumping signal; a first charge transfer switch circuit connecting the second boost node to the third boost node in response to the first and second pumping signals; a second charge transfer switch circuit connecting the first boost node to the fourth boost node in response to the first and second pumping signals; a third charge transfer switch circuit connecting the third boost node to the fourth boost node in response to the first and third pumping signals; and a fourth charge transfer switch circuit connecting the fourth boost node to a boosted voltage in response to the first and fourth pumping signals.

According to an example embodiment, the first pumping terminal may include an NMOS transistor connected between a source of the supply voltage and the first boost node, a gate of which receives the first pumping signal; and a capacitor connected between the second pumping signal and the first boost node.

According to an example embodiment, the second pumping terminal may include a first NMOS transistor connected between the source of the supply voltage and the second boost node, a gate of which receives the first pumping signal; a first capacitor connected between the second pumping signal and the second boost node; a second NMOS transistor connected between the source of the supply voltage and the third boost node, a gate of which receives the first pumping signal; and a second capacitor connected between the third pumping signal and the third boost node.

According to an example embodiment, the third pumping terminal may include an NMOS transistor connected between the source of the supply voltage and the fourth boost node, a gate of which receives the first pumping signal; and a capacitor connected between the fourth pumping signal and the fourth boost node.

Accordingly, a boosted voltage generating circuit according to example embodiments is capable of selectively controlling a bulk voltage of a transistor in a charge transfer switch circuit in order to increase the efficiency of charge transfer during charge transfer, and reducing and/or preventing a backflow of charges during precharging.

BRIEF DESCRIPTION OF THE DRAWINGS

The above and other aspects and advantages of example embodiments will become more apparent from a review of the detailed description of example embodiments referring to the attached drawings in which.

DETAILED DESCRIPTION OF EXAMPLE EMBODIMENTS

Figure 1:
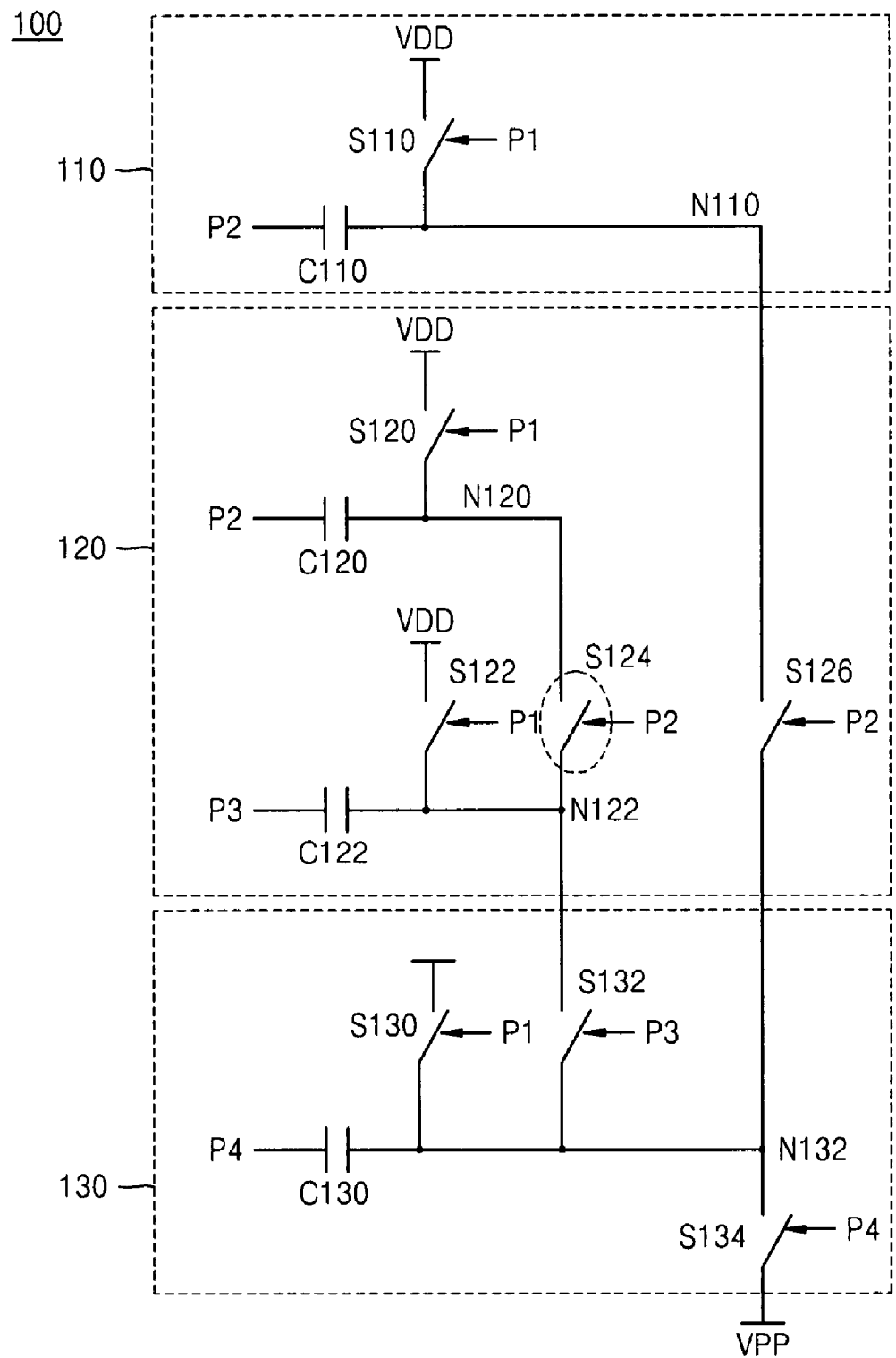
FIG. 1 is a conceptual diagram of a conventional boosted voltage generating circuit.
Figure 2:
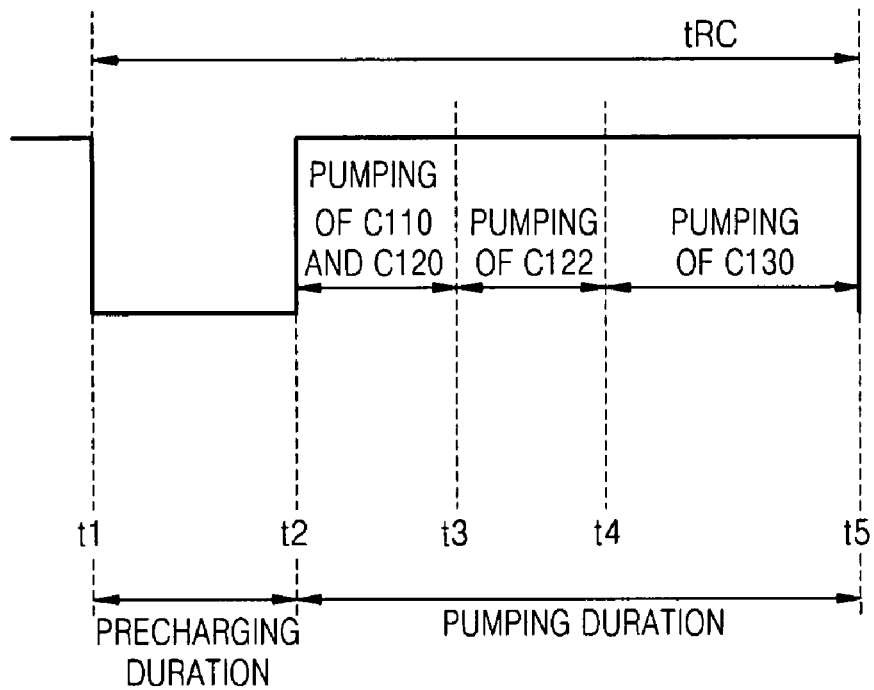
FIG. 2 is a timing diagram illustrating an operation of the conventional boosted voltage generating circuit of FIG. 1.
Figure 3:
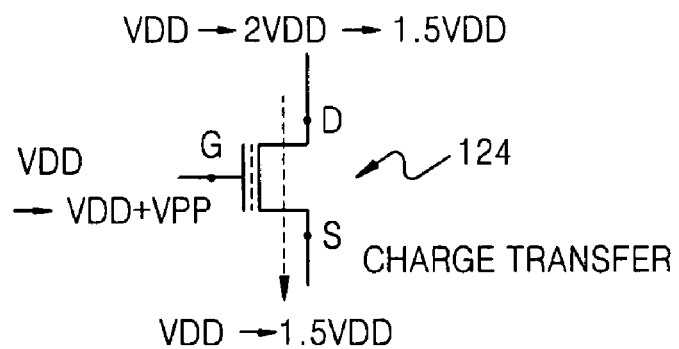
FIG. 3 illustrates a conventional charge transfer operation of a switch S124 of FIG. 1.
Figure 4:
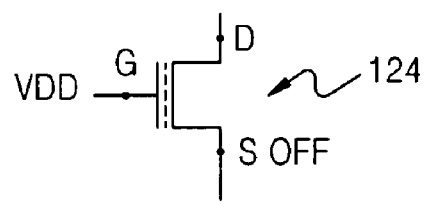
FIG. 4 illustrates a conventional precharging operation of the switch S124 of FIG. 1.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The example embodiments described below with respect to the drawings are provided so that this disclosure will be thorough and complete. In the drawings, like numbers refer to like elements throughout.

Figure 5:
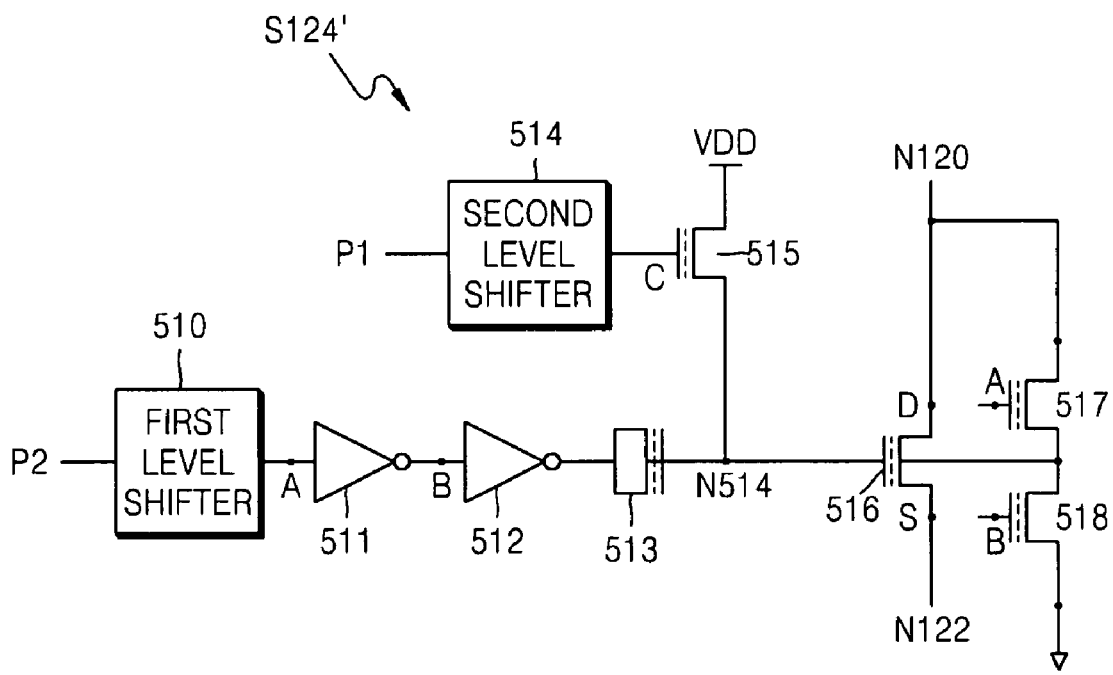
FIG. 5 is a circuit diagram of an example embodiment of a charge transfer switch circuit, which may be used to replace one or more of the switches included in the conceptual diagram of FIG. 1.

FIG. 5 is a circuit diagram of an example embodiment of a charge transfer switch circuit S124'. The charge transfer switch circuit S124' replaces the conventional switch S124 shown in FIG. 1. The charge transfer switch circuit S124' may include a first level shifter 510, a first inverter 511, a second inverter 512, a capacitor 513, a second level shifter 514, a first transistor 515, a second transistor 516, a third transistor 517, and a fourth transistor 518.

According to the example shown in FIG. 5, the first level shifter 510 generates a first control signal A by increasing the level of a second pumping signal P2. The first inverter 511 receives the first control signal A and generates a second control signal B. The second inverter 512 receives the second control signal B and provides an inverted version of the control signal B to a first terminal of the capacitor 513. The second level shifter 514 generates a third control signal C by increasing the level of a first pumping signal P1 and provides the third control signal C to the gate of the first transistor 515. The first transistor 515 is connected between a supply voltage VDD and a second terminal of the capacitor 513, and the gate of the first transistor 515 receives the third control signal C. The second transistor 516 has a gate connected to a node N514, which is connected to the second terminal of the capacitor 513. The second transistor 516 is connected between a second boost node N120 and a third boost node N122. The third transistor 517 has a gate, which receives the first control signal A. The third transistor 517 is connected between the second boost node N120 and a bulk voltage of the second transistor 516. The fourth transistor 518 has a gate, which receives the second control signal B. The fourth transistor 518 is connected between the bulk voltage of the second transistor 516 and a ground voltage VSS.

Figure 6:
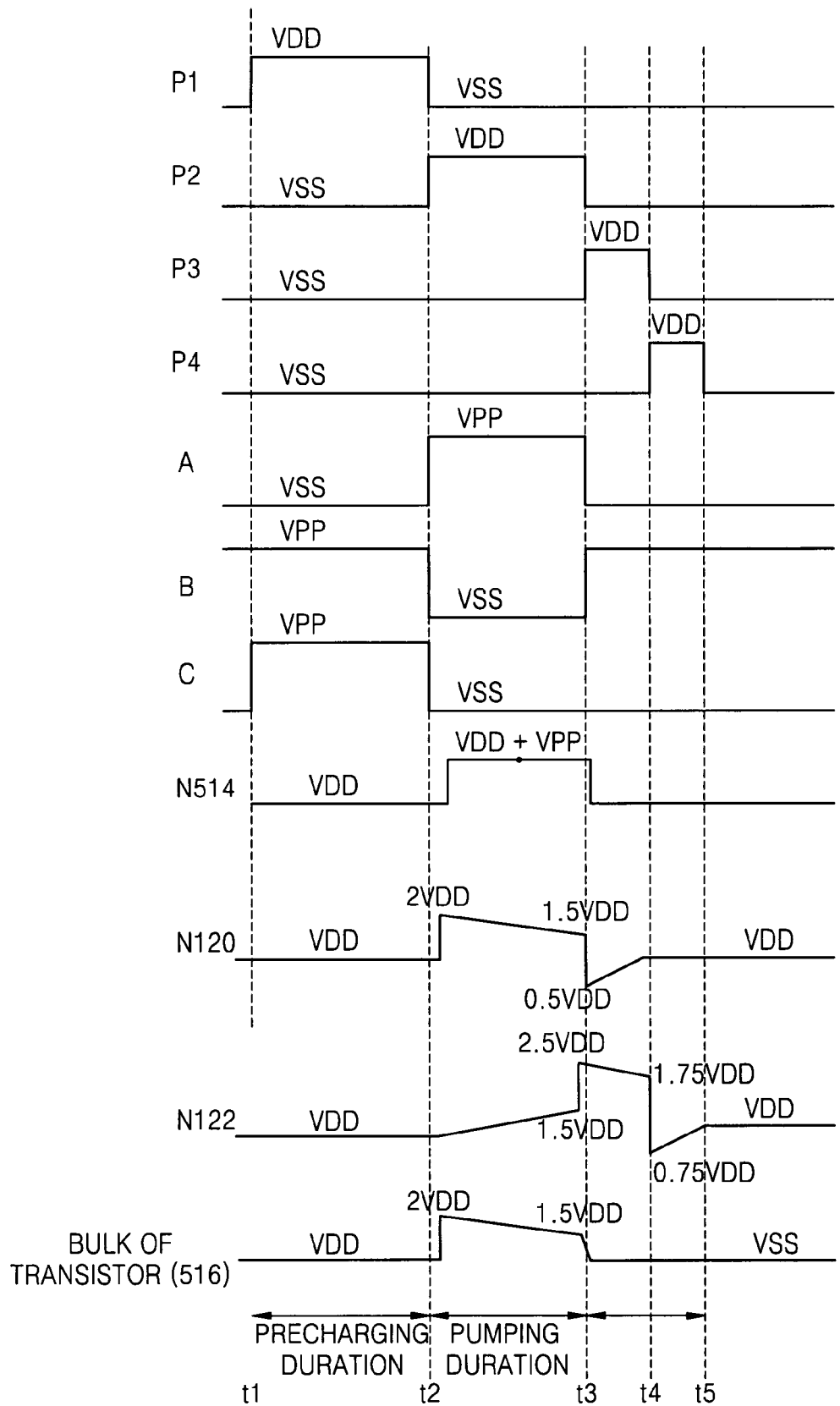
FIG. 6 is a timing diagram illustrating an example operation of the charge transfer switch circuit of FIG. 5 used in the boosted voltage generating circuit 100 of FIG. 1, according to an embodiment of the present invention.

FIG. 6 is a timing diagram illustrating an example operation of the charge transfer switch circuit S124' of FIG. 5 in association with the boosted voltage generating circuit 100 of FIG. 1 according to an example embodiment. Referring to FIGS. 5 and 6, in a precharging duration between times t1 and t2, when the first pumping signal P1 is high, the voltage of the third control signal C is increased. In the example of FIG. 6, if the first pumping signal P1 is equal to VDD, the voltage of the control signal C is equal to VPP. Increasing the control signal C to VPP activates the first transistor 515. As such, in the precharging duration, the voltage at the gate node N514 of the second transistor 516 is equalized. In the example of FIG. 6, the voltage at the gate node N514 is equalized with the supply voltage VDD during the precharging duration. Further, the switches S120 and S122 of FIG. 1 are activated in the precharging duration to equalize the voltages at the second and third boost nodes N120 and N122, respectively, with the supply voltage VDD. Still further, the bulk voltage of the second transistor 516 is equalized with the ground voltage VSS because the fourth transistor 518 is activated when the second control signal B is high. In the example of FIG. 6, the second control signal B is VPP during the precharging duration.

In a first pumping duration between times t2 and t3, when the second pumping signal P2 is high, the voltage of the first control signal A is increased. In the example of FIG. 6, if the second pumping signal P2 is equal to VDD, the voltage of the first control signal A is VPP. Thus, during the first pumping duration, the voltage at the gate node N514 of the second transistor 516 becomes a voltage VDD+VPP, and the voltage at the second boost node N120 becomes a voltage 2VDD because of the capacitor C120 of FIG. 1. Further, during the first pumping duration, the second boost node N120 is connected to the third boost node N122 via the activated second transistor 516. Charge sharing occurs between the voltage of the second boost node N120 and the voltage of the third boost node N122. As shown in the example of FIG. 6, because of this charge sharing, the voltage of the second boost node N120 changes from 2VDD to 1.5VDD and the voltage of the third boost node N122 changes from VDD to 1.5VDD. Further, the third transistor 517 is activated when the first control signal A is high. As such, in the example of FIG. 6, the bulk voltage of the second transistor 516 is changed from 2VDD to 1.5VDD because the third transistor 517 is activated when the first control signal A is VPP. As shown in the example of FIG. 6, the characteristics of the bulk voltage of the second transistor 516 are similar to the characteristics of the voltage of the second boost node N120 during the first pumping duration between times t2 and t3.

In a second pumping duration between times t3 and t4, the voltage of the gate node N514 of the second transistor 516 is equalized with the supply voltage VDD when the capacitor 513 is charged, and the voltage of the second boost node N120 is lowered to 0.5VDD and then charged from 0.5VDD to VDD when the capacitor C120 of FIG. 1 is charged. Further, the voltage of the third boost node N122 is increased to 2.5VDD by the capacitor C122 of FIG. 1 to which the third pumping signal P3. In the example of FIG. 6, the third pumping signal is equal VPP in the second pumping duration. The third boost node N122 is connected to the fourth boost node N132 via the activated switch S132 of FIG. 1 during the second pumping duration. Accordingly, charge sharing occurs between the third boost node N122 and the fourth boost node N132. As such, in the example of FIG. 6, the voltage of the third boost node changes from of 2.5VDD to 1.75VDD. The bulk voltage of the second transistor 516 is lowered to VSS by the fourth transistor 518, which is activated when the second control signal B is high. In the example of FIG. 6, the second control signal B is equal to VPP in the second pumping duration and thus, the fourth transistor 518 is activated.

In a third pumping duration between times t4 and t5, the third boost node N122 is lowered and then increased. As shown in the example of FIG. 6, the voltage of the third boost node N122 is sequentially lowered from 1.75VDD to 0.75VDD and then increased to VDD when the capacitor C122 of FIG. 1 is charged.

In the charge transfer switch circuit S124', a bulk voltage of the second transistor 516 is connected to the second boost node N120 which is the drain of the second transistor 516 to lower a threshold voltage Vt of the second transistor 516 during charge transfer, thereby increasing the efficiency of charge transfer according to an example embodiment. Also, in the charge transfer switch circuit S124', the bulk voltage of the second transistor 516 is connected to VSS to increase the threshold voltage Vt of the second transistor 516 during precharging, thereby preventing charges from flowing backward in the second transistor 516 according to an example embodiment. According to an example embodiment, the second transistor 516 is preferably a general NMOS transistor, not a device of a low threshold voltage Vt.

The charge transfer switch circuit S124' may be replaced with one or more of the switches S126, S132, and S134 illustrated in FIG. 1 that perform charge transfer. Accordingly, a boosted voltage circuit employing a charge transfer switch circuit according to an example embodiment is capable of increasing the efficiency of charge transfer during charge transfer and reducing and/or preventing a backflow of charges during precharging.

While this invention has been particularly shown and described with reference to example embodiments, it will be understood by those skilled in the art that various changes in form and details may be made therein without departing from the spirit and scope of the invention as defined by the appended claims.

What is claimed is:

1. An electric charge transfer switch circuit comprising:
  a first inverter receiving a first control signal requesting charge transfer, and generating a second control signal;
  a second inverter receiving the second control signal;
  a capacitor, a first terminal of the capacitor is connected to an output of the second inverter;
  a first transistor connected between a source of a supply voltage and a second terminal of the capacitor, a gate of the first transistor receiving a precharge signal;
  a second transistor connected between a first node and a second node, a gate of the second transistor being connected to the other terminal of the capacitor;
  a third transistor connected between the first node and a bulk voltage of the second transistor, a gate of the third transistor receiving the first control signal; and
  a fourth transistor connected between the bulk voltage of the second transistor and a source of a ground voltage, a gate of the fourth transistor receiving the second control signal.

2. The electric charge transfer switch circuit of claim 1, wherein the first and second control signals and the precharge signals are generated with a boosted voltage greater than the supply voltage.

3. The electric charge transfer switch circuit of claim 1, wherein the first through fourth transistors are NMOS transistors.

* * * * *